US008394714B2

(12) United States Patent
Bell

(10) Patent No.: US 8,394,714 B2
(45) Date of Patent: Mar. 12, 2013

(54) ANTI-REFLECTIVE COATINGS FOR MICRO-FLUID APPLICATIONS

(75) Inventor: Byron V. Bell, Paris, KY (US)

(73) Assignee: Lexmark International, Inc., Lexington, KY (US)

( * ) Notice: Subject to any disclaimer, the term of this patent is extended or adjusted under 35 U.S.C. 154(b) by 285 days.

(21) Appl. No.: 12/847,494

(22) Filed: Jul. 30, 2010

(65) Prior Publication Data

US 2012/0026234 A1 Feb. 2, 2012

(51) Int. Cl.
*H01L 21/4763* (2006.01)

(52) U.S. Cl. ... 438/636; 438/72; 438/311; 257/E21.006; 257/E21.029; 257/E21.149; 257/E21.202; 257/E21.206; 257/E21.32; 257/E21.312

(58) Field of Classification Search .................... 438/70, 438/72, 311, 636, 952, 779, 785; 257/E21.006, 257/E21.029, E21.149, E21.202, E21.206, 257/E21.312, E21.32
See application file for complete search history.

(56) References Cited

U.S. PATENT DOCUMENTS 3,922,774 A * 12/1975 Lindmayer et al. ............. 438/72
4,156,622 A 5/1979 Lindmayer
4,673,476 A 6/1987 Mitsui et al.
6,004,850 A * 12/1999 Lucas et al. ................... 438/301
7,254,890 B2 * 8/2007 Barnes et al. ................ 29/890.1
7,600,858 B2 * 10/2009 Barnes et al. ................... 347/56

OTHER PUBLICATIONS

"Lexmark Competitive Analysis Canon PF-01 Printhead", 2 pp, Jan. 26, 2007.
"Tantalum Oxide, Ta2O5 for Optical Coating", 2 pp, CERAC Incorporated (c) 2007, printed Jul. 2010.
"Fundamental Principles of Optical Lithography, The Science of Microfabrication", by Chris A. Mack, 2 pp, section 4.1.5, (c) 2007.
"Interference (Wave Propagation)", wikipedia.org, 12 pp, printed Jul. 27, 2010.
"Refractive Index", wikipedia.org, 21 pp, printed Jul. 27, 2010.

* cited by examiner

*Primary Examiner* — David Nhu

(57) ABSTRACT

Micro-fluid ejection heads have anti-reflective coatings. The coatings destructively interfere with light at wavelengths of interest during subsequent photo imaging processing, such as during nozzle plate imaging. Methods include determining wavelengths of photoresists. Layers are applied to the substrate and anodized. They form an oxidized layer of a predetermined thickness and reflectivity that essentially eliminates stray and scattered light during production of nozzle plates. Process conditions include voltages, biasing, lengths of time, and bathing solutions, to name a few. Tantalum and titanium oxides define further embodiments as do layer thicknesses and light wavelengths.

18 Claims, 3 Drawing Sheets

ANTI-REFLECTIVE COATINGS FOR MICRO-FLUID APPLICATIONS

FIELD OF THE INVENTION

The present invention relates to micro-fluid ejection devices, such as inkjet printheads. More particularly, although not exclusively, it relates to thin film layers on ejection chips forming anti-reflective coatings (ARC). Tantalum and titanium oxides facilitate certain designs.

BACKGROUND OF THE INVENTION

The art of printing images with micro-fluid technology is relatively well known. A permanent or semi-permanent ejection head has access to a local or remote supply of fluid. The fluid ejects from an ejection zone to a print media in a pattern of pixels corresponding to images being printed. Over time, fluid nozzles of ejection chips have transitioned from cover plates separately laminated to substrates to integrated structures formed directly on the substrate. Photo imageable nozzle plates typify recent designs.

During manufacturing, design parameters dictate controlling stray or reflected light in areas where light-sensitive materials (photoresists) are developed. To minimize reflections, the semiconductor industry often turns to anti-reflective coatings (ARC's). For a fluid firing element on the substrate, such as an inkjet heater, ARC's are applied directly on the resistive heater surface. For proper inkjet operation, however, it is contrarily desirable to have a bare heater surface. Layers also add cost. The apparent conflict leaves few good options during chip manufacturing, inkjet operation, or both.

Accordingly, a need exists for reducing reflectivity during manufacturing, while also avoiding performance degradation during printing. Additional benefits and alternatives are also sought when devising solutions.

SUMMARY OF THE INVENTION

The above-mentioned and other problems become solved with anti-reflective coatings for micro-fluid applications. A micro-fluid ejection head has an ejection chip formed of a base substrate. Coatings on the substrate destructively interfere with light at wavelengths of interest during subsequent photo imaging of nozzle plates. Among other things, they tend to eliminate stray and scattered light. They improve chip quality and consistency by providing a repeatable and optimized surface for photo imageable nozzle plates without degrading the performance of the inkjet ejector Methods of making chips include anodizing layers to form oxides. The oxides define predetermined thicknesses and reflectivity at wavelengths of interest. Processing conditions include suitable voltages, biasing arrangements, timing constraints, and bathing solutions. Tantalum and titanium oxides facilitate certain embodiments as do layer thicknesses and light wavelengths. Photoresists in the photo imaging define wavelengths.

These and other embodiments will be set forth in the description below. Their advantages and features will become readily apparent to skilled artisans. The claims set forth particular limitations.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE ILLUSTRATED EMBODIMENTS

In the following detailed description, reference is made to the accompanying drawings where like numerals represent like details. The embodiments are described in sufficient detail to enable those skilled in the art to practice the invention. It is to be understood that other embodiments may be utilized and that process, electrical, and mechanical changes, etc., may be made without departing from the scope of the invention. Also, the term wafer or substrate includes any base semiconductor structure, such as silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures hereafter devised or already known in the art. The following detailed description, therefore, is not to be taken in a limiting sense and the scope of the invention is defined only by the appended claims and their equivalents. In accordance with the present invention, methods and apparatus include anti-reflective coatings for a micro-fluid ejection head, such as an inkjet printhead.

Embodiments of the invention relate to use of an oxide layer of tantalum or titanium with tightly controlled thicknesses and indices of refraction. The oxide is formed by anodization in areas of an ejection chip where reflectivity requires subsequent control and minimization during nozzle plate imaging operations. The thickness and refractive index of the layer are matched to the exposure wavelength range used during later photo imaging processes. In one instance, the photoresist selected for later imaging defines the wavelength of interest. A common wavelength is 365 nm (I-line).

Figure 1:
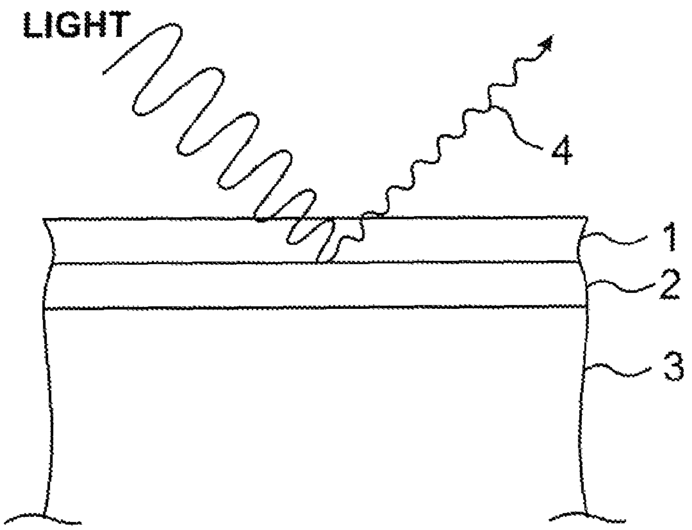
FIG. 1 is a diagrammatic view in accordance with the teachings of the present invention of an anti-reflective coating for micro-fluid applications.

The coverage and characteristics of the oxide material define a destructive interference of light during the photo imaging that enables the photoresist processing to occur in the presence of light, but with fewer reflections to improve image quality. During this time, light travels (FIG. 1) at the wavelength under consideration from exterior the oxide 1 and through a thickness of the oxide. It reflects against underlying base layers 2 on the substrate 3. The base layers typify earlier layers applied on the substrate, such as silicon nitride, portions of the tantalum or titanium whose exterior surface did not anodize into the thickness of tantalum oxide or titanium oxide, or both. At 4, the light exits through the top surface of the oxide. Also at 4, the light has a reflectively that is lesser than would otherwise exist without anodization of the original tantalum or titanium layer. From optical science, destructive interference teaches that light waves propagate in waves. When two waves are $\pi$ radians apart, or 180° out-of-phase, one wave crests as the other wave bottoms. Their amplitudes cancel out one another and light ceases to exist. In practice, however, there are a wide a range of incident waves, and some reflect "off axis." Not all light reflections are eliminated, but substantial reductions in reflectivity are found to occur.

Example

Figure 2:
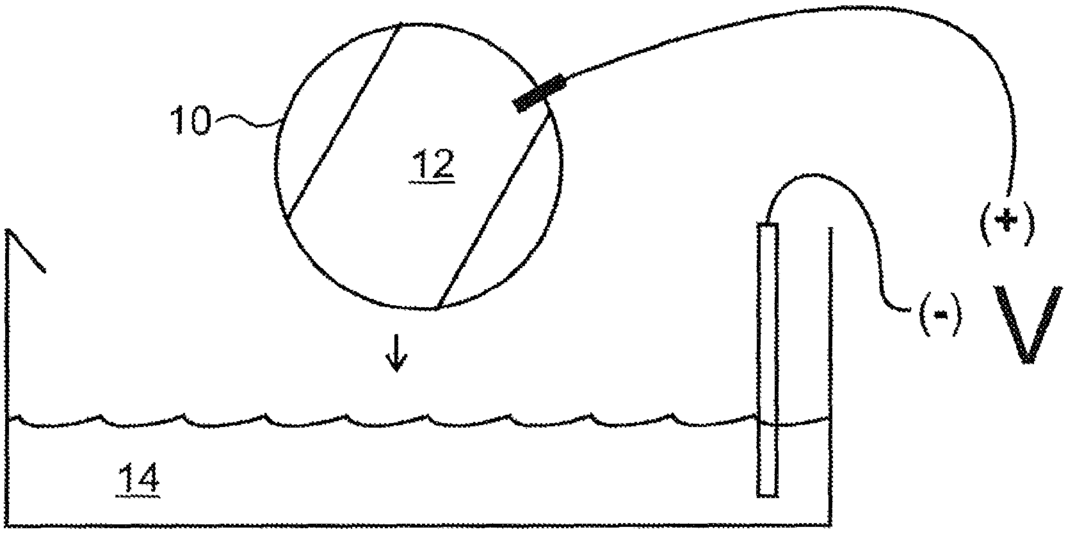
FIG. 2 is a diagrammatic view in accordance with the teachings of the present invention of an anodizing process for anti-reflective coatings.

With reference to FIG. 2, a substrate 10 includes first and second layers of nitride and tantalum 12. The substrate is deposited in a bathing solution 14. The solution is acetic acid, but other baths contemplate any electrolytic solution. A voltage potential +/−Vdc is applied across the substrate and bath. The former receives the voltage from a first electrode 16, while the latter receives it from a second electrode 18. For a predetermined period of time, the substrate resides in the bath with the voltage bias applied. A tantalum oxide (TaOx) grows to a predetermined thickness.

The physical parameters of a representative TaOx film are as follows:

t=thickness required for destructive interference;

n=refractive index of the TaOx at the wavelength of interest; and l=wavelength of incident light, where the minimum value of t required for minimal reflection is given by t=(¼*l/n) (assuming ¼ wavelength. Thickness solutions also exist at ¾, 1¼, 1¾, etc. wavelengths. It is known that incremental increases in the thickness by an amount equal to ½ the wavelength*n of the incident light further results in destructive interference. There is an "ordered effect." These other solutions exist at t=(¼*ln)+x(½*ln) where x is any whole number.)

With a photoresist during subsequent photo imaging operations selected at an I-line (365 nm) wavelength, the thickness t of the TaOx becomes t=(¼*3650 Å/2.26)=404 Å. Other solutions exist at 404 Å+x(808)Å or, 404 Å, 1212 Å, 2020 Å, 2828 Å, etc.

Figure 3A:
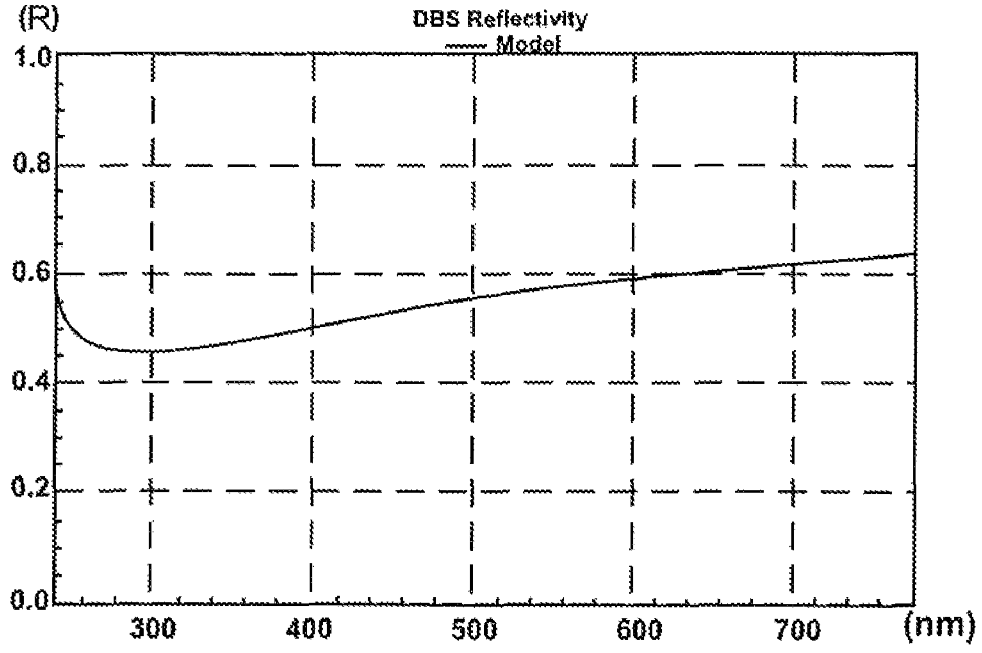
FIGS. 3A and 3B are comparative graphs in accordance with the teachings of the present invention showing improved reflectivity at wavelengths of interest.
Figure 3B:
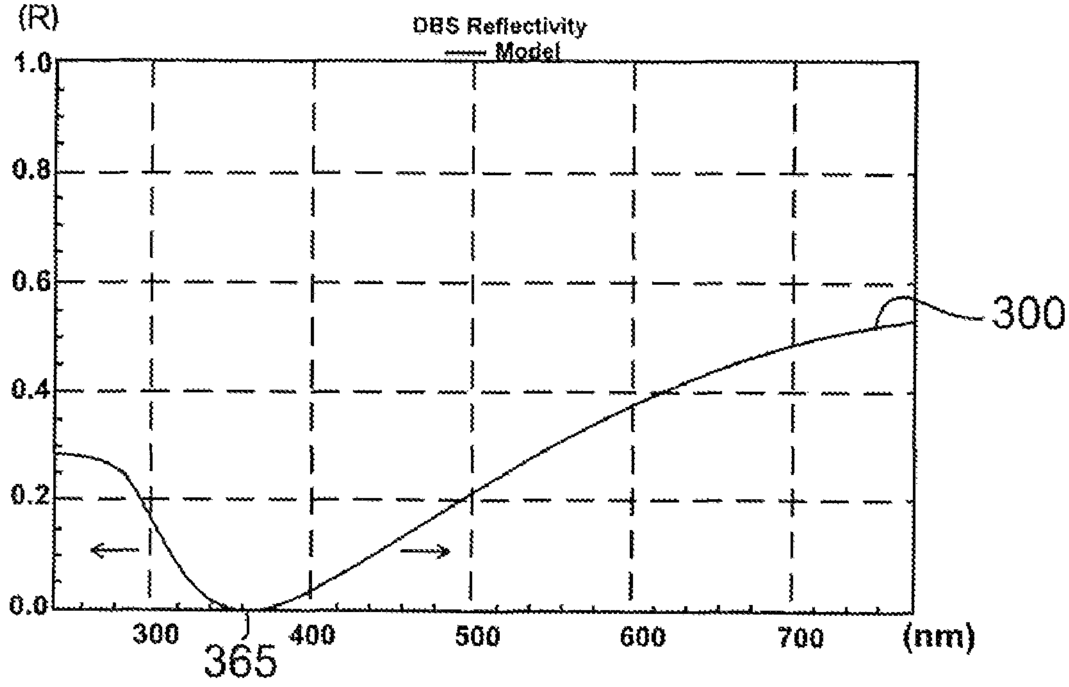
Figure 4:
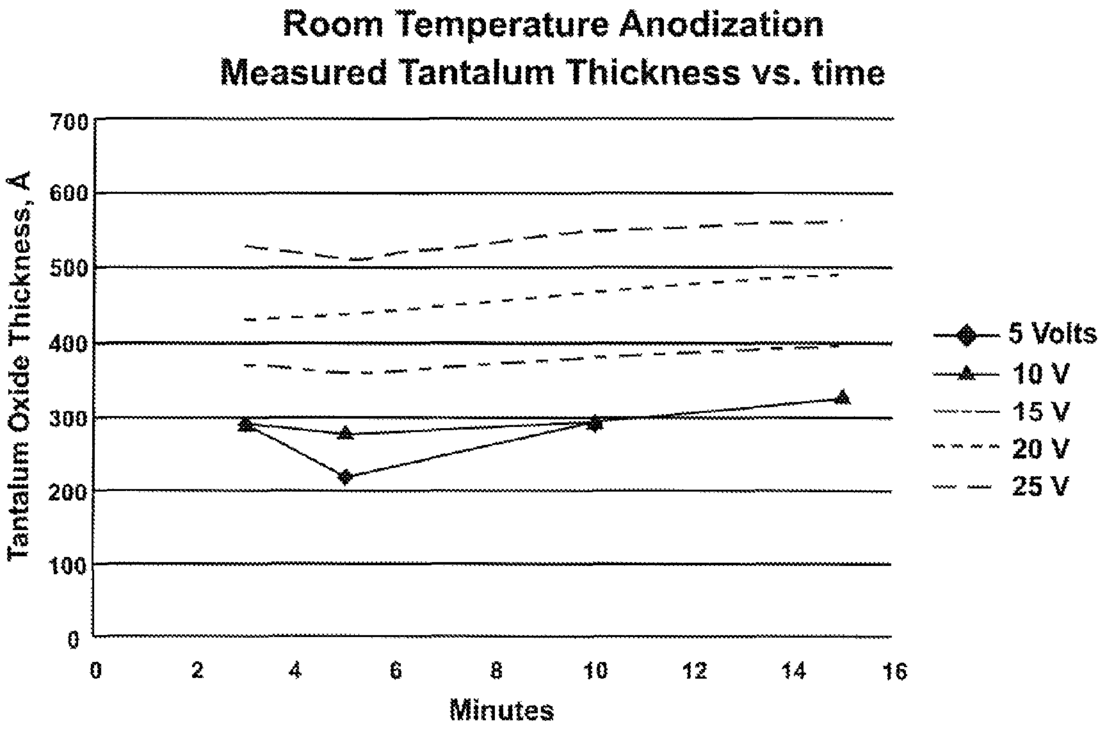
FIG. 4 is a graph in accordance with the teachings of the present invention for anodizing conditions.

In other embodiments, the thickness is contemplated in a range from about 200 to about 600 angstroms. A presently preferred design contemplates a smaller range of about 275 to about 420 angstroms with about 330 angstroms being optimal. For any design, FIGS. 3A and 3B illustrate reflectivity comparisons between bare tantalum (FIG. 3A) and anodized tantalum (FIG. 3B). For wavelengths between 200 and 600 nm, the former reveals reflectivity from about 0.4 to about 0.5. At 365 nm, the reflectivity is about 0.5. The latter, however, reveals reflectivity approaching zero for TaOx at a wavelength of about 365 nm. The result provides superior reflectivity conditions and does not hinder normal inkjet operations. (The curve 300 shifts laterally in the direction of the arrows for other thicknesses.)

Example II

The following data represents thirteen different wafers anodized together in a common test (internal lot #8162922). The test conditions included a bathing solution of acetic acid and a voltage potential of 15 volts for a period of about 3 minutes. As is seen, wafers 1-10, 12 and 13 have consistently thick tantalum oxide in a range from 343-347 angstroms (tested at a wafer center.) Similarly, these same wafers indicate destructive interference at light wavelengths of 365 nm at measured reflectivity values in a range from 0.0167-0.0180. Such compares favorably to a layer of bare tantalum at a measured reflectivity of 0.39. Wafer 11, however, has inconsistent thickness and measured reflectivity. It is believed that rudimentary processing conditions contributed to the error. The wafers were manually soaked in the bath, including hand applied voltages by way of an alligator clip on the substrate. Otherwise, the inventors believe a more uniform process will result in desired effects.

Results of anodization for lot 8162922:

15V, 3 min in weak acetic acid

| Wafer | TaOx, Å @ Center | Reflectivity* @ 365 nm |
|---|---|---|
| 1 | 347 | 0.0167 |
| 2 | 343 | 0.0179 |
| 3 | 346 | 0.0170 |
| 4 | 345 | 0.0175 |
| 5 | 346 | 0.0170 |
| 6 | 344 | 0.0175 |
| 7 | 344 | 0.0177 |
| 8 | 342 | 0.0181 |
| 9 | 343 | 0.0180 |
| 10 | 346 | 0.0169 |
| 11 | 315 | 0.0364 |
| 12 | 347 | 0.0169 |
| 13 | 347 | 0.0169 |

*Comparative reference for a layer of bare tantalum = 0.39.

With reference to FIG. 3, skilled artisans appreciate numerous processing conditions can contribute to anodizing the substrate. Among the more relevant considerations are biasing conditions, voltage potentials, anodization times, and temperature. With results from actual experiments, it is observed that between about 10-15 Vdc, an oxide film of 275-350 angstroms can be rapidly formed at room temperature. The (low) voltages in these ranges are also believed to avoid harming other sensitive electronic structures on the substrate.

The foregoing has been presented for purposes of illustrating the various aspects of the invention. It is not intended to be exhaustive or to limit the claims. Rather, it is chosen to provide the best illustration of the principles of the invention and its practical application to enable one of ordinary skill in the art to utilize the invention, including its various modifications that naturally follow. All such modifications and variations are contemplated within the scope of the invention as determined by the appended claims. Relatively apparent modifications include combining one or more features of various embodiments with one another.

The invention claimed is:

1. A method of making a micro-fluid ejection head on a substrate undergoing subsequent photo imaging, comprising:

determining a wavelength of interest of a photoresist layer used in the subsequent photo imaging; and forming a layer on the substrate at a predetermined thickness and at a predetermined index of refraction at said wavelength of interest to destructively interfere with light at said determined wavelength during the subsequent photo imaging, wherein the forming the layer further includes anodizing the substrate to achieve an oxide layer.

2. The method of claim 1, wherein the forming the layer further includes applying a tantalum layer wherein the anodizing further includes anodizing the applied layer into tantalum oxide.

3. The method of claim 1, wherein the forming the layer further includes applying a titanium layer wherein the anodizing further includes anodizing the applied layer into titanium oxide.

4. The method of claim 1, wherein the anodizing further includes bathing the substrate in a solution of acetic acid.

5. The method of claim 1, wherein the anodizing further includes applying a voltage between the substrate and an anodizing solution.

6. The method of claim 5, further including applying the voltage at a discrete voltage level selected in the range from about 10 to about 20 volts dc for a time selected in a range from about 1 to about 4 minutes.

7. The method of claim 1, further including forming the oxide into the predetermined thickness selected in a range from about 275 to about 420 angstroms.

8. A method of making a micro-fluid ejection head on a substrate undergoing subsequent photo imaging, comprising:
- determining a wavelength of interest of a photoresist layer used in the subsequent photo imaging;
- applying a layer on the substrate before the photo imaging;
- anodizing the layer into an oxide before the photo imaging, the oxide having reflectivity of light at said determined wavelength of interest that destructively interferes with the light during the subsequent photo imaging.

9. A method of making a micro-fluid ejection head on a substrate eventually undergoing photo imaging, comprising:
- determining a wavelength of interest of a photoresist layer used in the subsequent photo imaging;
- applying a layer of tantalum on the substrate before the photo imaging;
- anodizing the tantalum into a thickness of tantalum oxide before the photo imaging, the tantalum oxide destructively interfering with light at said determined wavelength of interest during the subsequent photo imaging.

10. The method of claim 9, wherein the anodizing further includes bathing the substrate in a solution of acetic acid.

11. The method of claim 10, further including applying a voltage potential between the substrate and the solution.

12. The method of claim 11, further including forming the tantalum oxide into the thickness selected in a range from about 275 to about 420 angstroms.

13. The method of claim 11, further including applying the voltage potential at a discrete voltage level selected in the range from about 10 to about 20 volts dc.

14. The method of claim 9, further including selecting the photoresist layer at an I-line wavelength.

15. The method of claim 14, wherein the anodizing further includes anodizing an exposed outer surface of said applied layer of tantalum into the thickness of said tantalum oxide at about 330 angstroms wherein the applied layer of tantalum is relatively thicker than the outer surface of said tantalum oxide.

16. The method of claim 9, further including undertaking the photo imaging of the substrate while the tantalum oxide destructively interferes with light at the wavelength of interest.

17. The method of claim 11, further including applying the voltage potential for a time selected in a range from about 1 to about 4 minutes.

18. The method of claim 9, further including transforming the applied layer of tantalum into said tantalum oxide with a reflectivity of less than about 0.1 at said wavelength of interest.

* * * * *